US006006027A

United States Patent [19]
Downey

[11] Patent Number: 6,006,027
[45] Date of Patent: Dec. 21, 1999

[54] METHOD AND APPARATUS FOR EVENT SIMULATION

[75] Inventor: John H. Downey, San Jose, Calif.

[73] Assignee: Synopsys, Inc., Mountain View, Calif.

[21] Appl. No.: 08/915,285

[22] Filed: Aug. 20, 1997

[51] Int. Cl.[6] .................................................. G06F 9/455
[52] U.S. Cl. ............................... 395/500.38; 395/500.37; 395/874; 713/502
[58] Field of Search ............................... 395/500, 500.34, 395/500.35, 500.36, 500.37, 500.38, 874; 706/920; 364/578; 713/502; 714/39

[56] References Cited

U.S. PATENT DOCUMENTS

| | | | |
|---|---|---|---|
| 4,796,178 | 1/1989 | Jennings et al. | 364/200 |
| 4,914,569 | 4/1990 | Levine et al. | 364/200 |
| 5,197,002 | 3/1993 | Spencer | 364/406 |
| 5,202,986 | 4/1993 | Nickel | 395/600 |
| 5,204,958 | 4/1993 | Cheng et al. | 395/600 |
| 5,283,894 | 2/1994 | Deran | 395/600 |
| 5,418,947 | 5/1995 | Hsu et al. | 395/600 |
| 5,423,018 | 6/1995 | Dang et al. | 395/425 |
| 5,463,562 | 10/1995 | Theobald | 364/489 |
| 5,465,335 | 11/1995 | Anderson | 395/375 |
| 5,467,462 | 11/1995 | Fujii | 395/500.37 |
| 5,497,485 | 3/1996 | Ferguson et al. | 395/600 |
| 5,519,701 | 5/1996 | Colmant et al. | 370/60.1 |
| 5,544,348 | 8/1996 | Umeda et al. | 395/500 |
| 5,560,007 | 9/1996 | Thai | 395/600 |
| 5,581,756 | 12/1996 | Nakabayashi | 395/602 |
| 5,684,724 | 11/1997 | Sutherland | 395/500.38 |
| 5,764,953 | 6/1998 | Collins et al. | 395/500.38 |
| 5,856,933 | 1/1999 | Maurer | 395/500.37 |

OTHER PUBLICATIONS

P. Gillard et al., "*A Hierarchical View of Time*", Proceedings of the 34th Midwest Symposium on Circuits and Systems, IEEE, 1992, pp. 908–911, vol. 2.

G. Beihl, "*A Shared–Memory Multiprocessor Logic Simulator*", 8th Annual Int'l Phoenix Conf. Proceedings on Computers and Communications, IEEE, 1989, pp. 26–28.

B. Ackland et al., "*Event–EMU: An Event Driven Timing Simulator for MOS VLSI Circuits*", 1989 IEEE Int'l Conf. on Computer–Aided Design, ICCAD–89, Digest of Technical Papers, pp. 80–83.

A. Brown et al., "*Issues in the Design of a Logic Simulator: An Improved Caching Technique for Event–Queue Management*", IEE Proceedings—Circuits, Devices and Systems, Oct. 1995, vol. 142 5, pp. 293–298.

S. Prasad et al., "*Using Parallel Data Structures in Optimistic Discrete Eevent Simulation of Varying Ganularity on Shared–Memory Computers*", IEEE !st Int'l Conf. On Algorithms and Architectures for Parallel Processing, 1995, ICAPP 95, pp. 365–374, vol. 1.

*Primary Examiner*—Kevin J. Teska
*Assistant Examiner*—Russell W. Frejd
*Attorney, Agent, or Firm*—D'Alessandro & Ritchie

[57] ABSTRACT

A method and apparatus for inserting an event into a simulation time queue, wherein the simulation time queue is represented by a tree structure having a top node which represents the total number of "time slices" to be simulated, intermediate nodes representing subsets of time slices within the total number of time slices to be simulated, and event locations representing events to be simulated. A time slice is defined to represent a minimum resolvable time period within the simulation. The method includes the steps of choosing a starting node within the tree structure, designating it as the current location, determining whether the current location is an intermediate node representing a range of time slices of which the time slice of the event to be inserted is a subset, determining, if the current location is such an intermediate node, if any existing child nodes of said current location are event locations, and if so, adding the event to the proper event location of said current location.

7 Claims, 5 Drawing Sheets

METHOD AND APPARATUS FOR EVENT SIMULATION

BACKGROUND OF THE INVENTION

1. Field of the Invention

The present invention relates to a method and apparatus for event simulation. More particularly, the present invention uses a bit indexed time queue to speed the execution of simulated events.

2. The Background Art

As electronic systems have become more complex and more sophisticated, due to the high cost and time involved when building circuit prototypes, the desirability for performing simulation of new designs has significantly increased. With the increased complexity of the circuits being simulated, the time involved in performing the simulations has grown to a point where a complex simulation may take more than 24 hours to accomplish. It is vital to perform simulations of electronic circuits as rapidly as possible in order to reduce the total time required to get a product to market.

In order to perform the simulation of an electronic circuit, it is necessary that critical parameters relating to components being used in the circuit be known. Such critical parameters may be operating voltages, internal resistance, power dissipation, and timing characteristics. In addition to other characteristics, timing characteristics of a component determine at what time an event in a simulation will occur. An event, when simulating an electronic circuit, is defined as a change in state of a signal. For example, a rising pulse on one input of an AND gate is an event, as is the step function output of that same AND gate.

In other types of simulation such as flight operations, space simulation, automotive simulation, etc., events may be defined in different ways. It is the handling of events that is the subject of the present invention.

Referring again to the electrical example, the delay time between the two pulses may be one of many timing characteristics of a component involved in a simulation which is used to determine one or more times at which succeeding events should occur. At the time an event is created, often by the simulated occurrence of a previous triggering event, the event is placed in a time queue. As events are operated upon by the simulator, they are typically removed from the queue.

Various methods have been devised for tracking events to be simulated. One method is to place events, in order of occurrence, into an array.

FIG. 1 is a diagram depicting a typical arrangement of simulation events in an array.

Referring to FIG. 1, an array 10 comprises a queue 11 of N events in memory. In order to insert a new event A, it is required that the time at which event A occurs be known. That time is compared against the times associated with other events in the array 10 in order to determine the proper location to place event A into the queue. When that location is determined, events which follow event A's proper location in the queue 11 are bumped one location back in the queue 11, and event A is inserted into the empty location.

For example, if event A in FIG. 1 were to correspond to a simulation time which would place event A between events 5 and 6, such as shown in the figure, event N would be moved to array location N+1. Event N−1 would be moved to the array location previously occupied by event N, and so on, until event 6 was moved into array location 7. Event A would then be inserted into array location 6.

Although storing events in an array is a useful technique for its intended purposes, this method consumes a large quantity of valuable memory space that would be better used for other simulation operations. It would therefore be beneficial to provide a method for storing events into a simulation time queue which would consume low memory.

An alternative method for managing events in a queue uses a doubly linked list.

FIG. 2 is a drawing depicting the layout of a typical doubly linked list 12 used in a simulation time queue.

Referring to FIG. 2, a doubly linked list 12 is shown having N events. Although each record in the queue comprises similar information, only one record will be described, in order to avoid overcomplicating the disclosure. A typical event record 14 has, among other data, a parent link 16, and a child link 18. Parent link 16 points to the event in the simulation time queue which precedes an event in question, and child link 18 points to the event following an event in question. Thus, although the records may not be stored contiguously, they may still be ordered consecutively, based upon the time the particular event records will be processed during the simulation.

FIGS. 3A and 3B are diagrams depicting the method of inserting events into a queue represented by a doubly linked list.

Referring to FIG. 3A, a portion of a simulation time queue 19 is depicted wherein record 7692 has been created by the simulator, and needs to be inserted into the queue 19 in the proper place, in order to have the event associated with record 7692 be simulated at the proper time.

In order to determine that record 7692 should be inserted in the list at a given place in the queue 19 such as between records 3298 and 3299 as seen in FIG. 3A, the simulator may, beginning at the first record, compare the time that record 7692 must be acted upon to the simulation time scheduled for each other record already in the queue, until the proper time slot is found. In a typical simulation queue, there may be thousands of records to search, thus making the process of locating the proper insertion point very time consuming. Therefore, it would be beneficial to provide a method for inserting events into a simulation time queue wherein the proper insertion point is located quickly, without searching every preceding record in the queue.

When the proper insertion point is found, such as seen in FIG. 3A, record 7692 is inserted into the queue 19 in four steps, namely 1) modifying the child pointer 20 of the preceding record to point to record 7692, 2) modifying the parent pointer 22 for the inserted record to reflect the new parent record, 3) modifying the child pointer 24 of the inserted record to reflect the new child record, record 3299 as seen in FIGS. 3B, and 4) modifying the parent pointer 26 for the child record to point to the newly inserted record, as seen with record 3299 in FIG. 3B.

Although the newly inserted record is not necessarily contiguous with its parent record in memory, the parent pointer 16 and the child pointer 18 both provide adequate guidance for the system to locate records in the list in the proper sequence. The main difficulty with this system for managing a simulation time queue is that it is much slower than desired.

OBJECTS AND ADVANTAGES OF THE INVENTION

It is an object and advantage of the present invention to provide a method for storing events into a simulation time queue which would have a low memory consumption.

It is a further object and advantage of the present invention to provide a method for inserting events into a simulation time queue wherein the proper insertion point is located quickly, without searching every preceding record in the queue.

These and many other objects and advantages of the present invention will become apparent to those of ordinary skill in the art from a consideration of the drawings and ensuing description of the invention.

SUMMARY OF THE INVENTION

A method and apparatus for inserting an event into a simulation time queue, wherein the simulation time queue is represented by a tree structure having a top node which represents the total number of "time slices" to be simulated, intermediate nodes representing subsets of time slices within the total number of time slices to be simulated, and event locations representing events to be simulated. A time slice is defined to represent a minimum resolvable time period within the simulation. The method includes the steps of choosing a starting node within the tree structure, designating it as the current location, determining whether the current location is an intermediate node representing a range of time slices of which the time slice of the event to be inserted is a subset, determining, if the current location is such an intermediate node, if any existing child nodes of said current location are event locations, and if so, adding the event to the proper event location of said current location.

DESCRIPTION OF THE PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
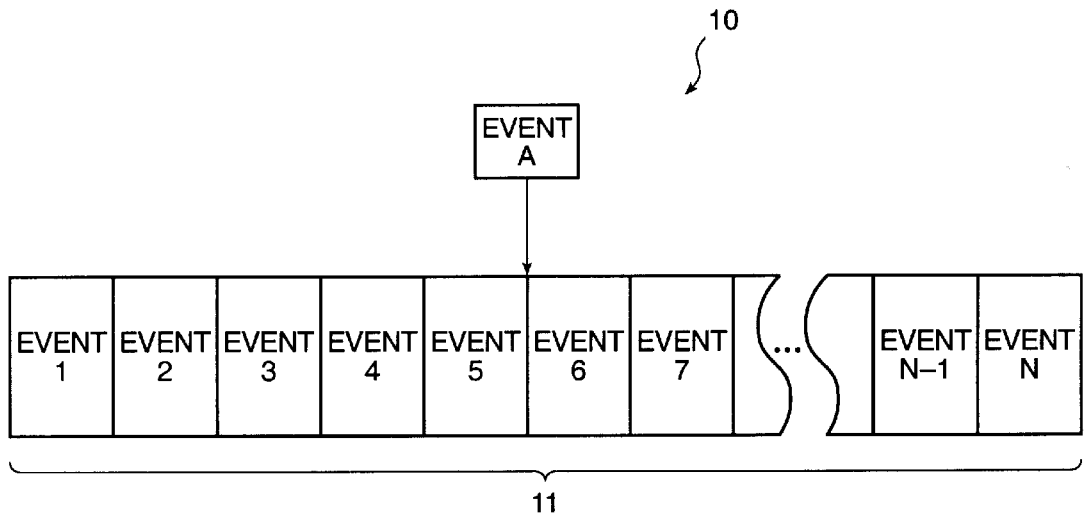
FIG. 1 is a diagram depicting a typical arrangement of simulation events in an array.
Figure 2:
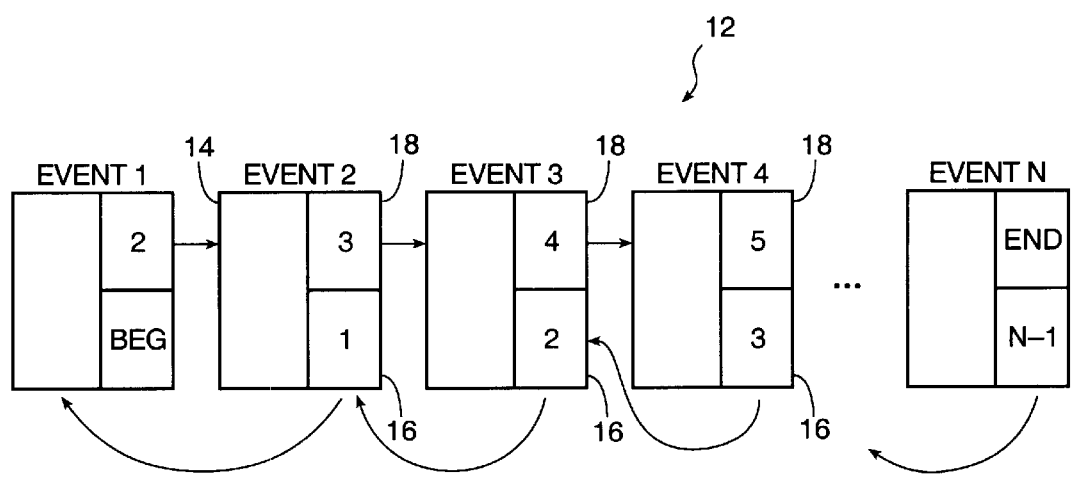
FIG. 2 is a drawing depicting the layout of a typical doubly linked list 12 used in a simulation time queue.
Figure 3A:
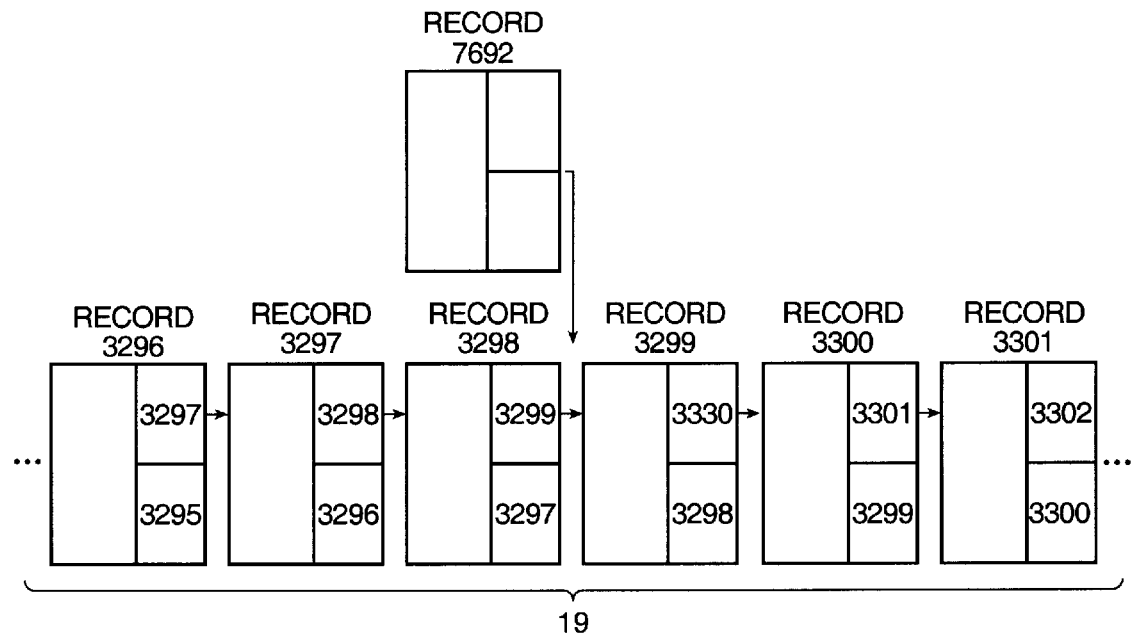
FIGS. 3A and 3B are diagrams depicting the method of inserting events into a queue represented by a doubly linked list.
Figure 3B:
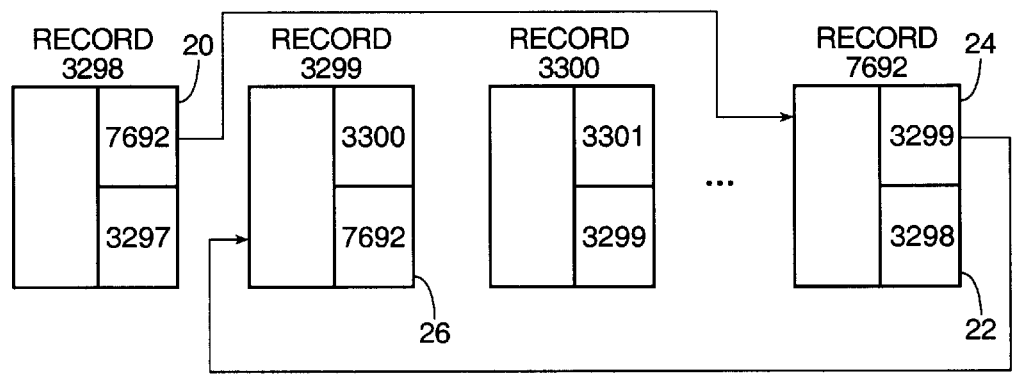
Figure 4:
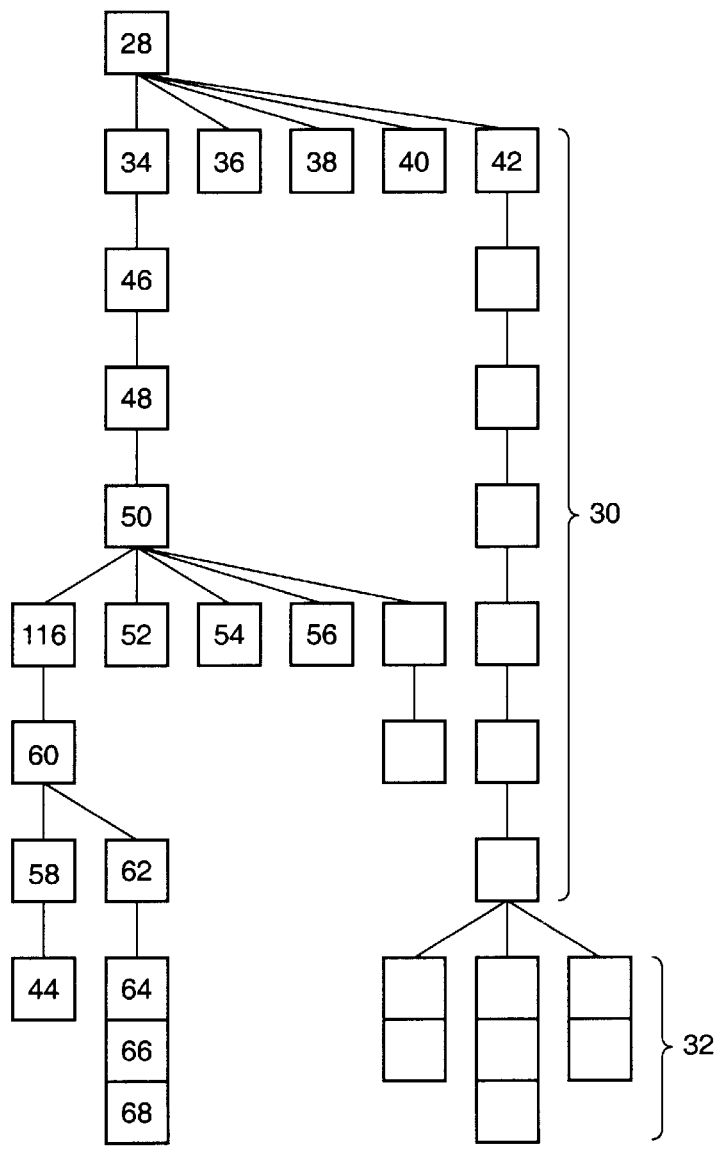
FIG. 4 is a diagram depicting a typical hex tree constructed according to a presently preferred embodiment of the present invention.

FIG. 4 is a diagram depicting a hex tree constructed in accordance with a presently preferred embodiment of the present invention.

The hex tree used in a presently preferred embodiment of the present invention has a maximum of sixteen child nodes linked to a parent node. Alternate embodiments contemplated by the inventors are binary trees, quad trees (up to 4 child nodes per parent node), 8-bit trees (up to 8 child nodes per parent node), 32-bit trees (up to 32 child nodes linked to each parent node), 64-bit trees, or any other convenient construction having child nodes linked to parent nodes in a tree structure.

Referring to FIG. 4, the tree is constructed with a top node 28, intermediate nodes 30, and event locations 32. The top node represents the total simulation period, and each successively lower level in the tree represents a smaller segment of the simulation period. A child node will always represent a subset of time slices of those time slices represented by the parent node.

In high-speed digital circuit simulations it is possible that several seconds of simulation might require a tree with up to $4 \times 10^9$ bottom nodes. However, due to the tendency of events in circuit simulations to be grouped together, significantly fewer than one percent of the available nodes in a hex tree are likely to be attached to simulation events at a time, depending on the complexity of the simulation being performed.

In order that each event location corresponds to a particular simulation time, it is necessary that a minimum resolvable time period for the system be defined. This minimum resolvable time period is that time period which will be the smallest period of time handled by the simulator during the simulation period. Thus, if the minimum resolvable time period is chosen by the operator to be 0.5 ns, no simulation event may occur at a time other than at a time which is an integer multiple of 0.5 ns. If the minimum resolvable time is 4 ns, then no event within the simulation may occur at a time other than integer multiples of that time, e.g. 4 ns., 8 ns., 12 ns., etc. The minimum resolvable time period is also defined as the time for one time slice to occur. Thus in a simulation having a minimum resolution of 1 ns, and an event which occurs 4 time slices from the current time period, the event will occur 4 ns from the current time being simulated.

For the purposes of this description, a minimum resolution of 1 ns is used, and a 32-bit hex tree is used, thus providing for $2^{32}-1$ possible different time slice times and a total simulation time of $2^{32}-1$ ns. (just over 4 seconds). In typical simulations, events tend to be grouped as discussed above, and the hex tree will not generally have events at every one of the possible event locations. Rather, many event locations will typically each have a hundred events or more to simulate which all occur at the same simulation time.

In actual implementation, the tree may be created only as necessary, beginning with the node immediately above the first event in the simulation, with other nodes and events being added as the simulation progresses. An alternative is to create the initial tree structure with the beginning event record and as many node levels above the event as required, depending on the total simulation time desired. Higher-level parent nodes may then be added to the top node as required for extra simulation time, if it is desired that simulation continue past the originally determined ending time slice.

In a presently preferred embodiment of the present invention, event locations only exist if there are events at those locations requiring simulation. Correspondingly, a given intermediate node generally doesn't exist unless there exists an event location below that particular intermediate node in the tree hierarchy.

Alternative embodiments are contemplated wherein intermediate nodes which don't have event locations associated with them are actually in place within the hex tree. Because of the slight increase in speed attained when only necessary nodes are present in the tree, however, it is preferred that only nodes and event locations necessary to the simulation be present in the tree at any given time.

Referring again to FIG. 4, using the parameters previously established, top node 28 represents $2^{32}-1$ separate time slices, with each time slice representing 1 ns of "real" time. Intermediate nodes 34, 36, 38, 40 and 42 represent five of the 16 possible nodes which may be directly linked as child nodes to node 28. These intermediate nodes 34, 36, 38, 40 and 42 each represent consecutive equal-sized blocks of simulation time periods. To simplify the discussion, event location 44 (at the bottom left corner of FIG. 4) will represent an event that occurs at time "now", and time now is the beginning of the simulation. This means that intermediate node 34 represents time slices 0x0000000 through 0xFFFFFFF, intermediate node 36 represents time slices 0x10000000 through 0x1FFFFFFF, and so on, for the other intermediate nodes 38, 40, and 42. Nodes 36, 38, and 40 are shown in FIG. 4 for illustrative purposes only. As previously described, these nodes 36, 38, and 40 do not currently have event nodes associated with them, and therefore do not exist in the actual implementation of a presently preferred embodiment of the present invention. These nodes may be added, if required, later in the simulation.

Those of ordinary skill in the art will readily recognize that numerical representations such as 0xFFFFFFF are intended to be read as hexadecimal numbers. Those skilled persons will readily recognize that sixteen possible nodes per "level" of the hex tree may each be represented by a unique hexadecimal digit, 0 through F. Each separate level of the hex tree is represented by the different digit positions within the hexadecimal representation used to describe a particular node, from the top of the tree (most significant digit, MSD) to the bottom of the tree (least significant digit, LSD).

If a quad tree is used instead of a hex tree, it may be more convenient, in that case, to describe the tree using the base 4 numbering system. Similarly, other numerical systems may conveniently describe other trees a designer may decide to use when practicing the present invention.

Intermediate node 46, being the first child node of node 34, represents the first sixteenth of the time period represented by node 34. Thus, intermediate node 46 represents time slices 0x000000 through 0xFFFFFF. Correspondingly, intermediate node 48 represents time slices 0x00000 through 0xFFFFF, node 50 represents time slices 0x0000 through 0xFFFF.

Nodes 52, 54, and 56 are drawn for illustrative purposes. Depending on the designers choice, nodes like nodes 52, 54, and 56 may or may not exist. Methods for handling the existence or non existence of a node will be described later.

Following the convention described earlier, node 52 represents time slices 0x1000 through 0x1FFF. By masking off certain digits of a time slice associated with a new event being inserted into the tree, the correct placement of the event into the queue may be easily determined. This is a tremendous advantage over a doubly linked list, where it was necessary to examine each record in the list until the correct insertion point for the new event was ascertained.

Following this convention, node 54 represents time slices 0x2000 through 0x2FFF. Other hexadecimal representations of nodes existing or not yet created in FIG. 4 may be readily determined by those of ordinary skill in the art, based upon the discussion and examples provided herein.

Node 44 is the node representing the current event being operated upon in the simulation. It is represented by time slice 0x0 (or 0x00000000, for the complete representation, if such complete representation is desired, according to the tree depicted in FIG. 4). When the simulator has finished simulating the event or events associated with node 44, the simulation will then eliminate event location 44 and node 58 from the tree, and then proceed down node 62 to continue with the simulation of the events represented by event locations 64, 66, and 68. Event locations 64, 66, and 68 are linked together, showing that they represent events occurring at the same time slice, and thus at the same time within the simulation. In reality, the event associated with one of those locations, 64 for example, will be simulated first, and the other two will follow soon after. However, the events associated with event locations 64, 66 and 68 are each simulated as if they occurred simultaneously, as it would be expected that they would occur within the electronic circuit being simulated, within the minimum resolution of the simulation. Any number of event locations may be associated with a given time slice in the system, thus allowing many events to occur "simultaneously" within the simulation.

Before proceeding, it is convenient to describe the construction of a record used to construct a hex tree.

Figure 5:
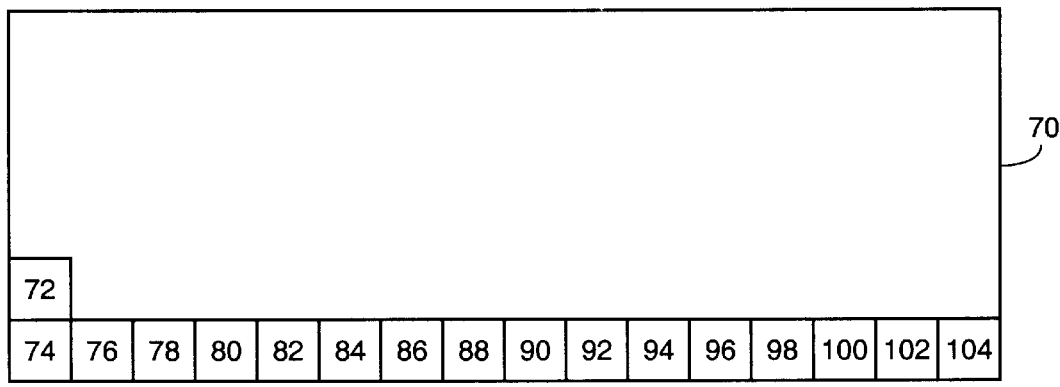
FIG. 5 is a diagram depicting a typical event record constructed according to a presently preferred embodiment of the present invention.

FIG. 5 is a diagram depicting a typical event record constructed according to a presently preferred embodiment of the present invention.

Referring to FIG. 5, a record 70, in addition to other data required for a proper simulation, comprises parent node pointer location 72, and child node pointer locations 74, 76, 78, 80, 82, 84, 86, 88, 90, 92, 94, 96, 98, 100, 102, and 104, one for each possible child nodes that may be linked to it. When constructing the tree as the simulation progresses, it is possible that some of the child node pointer locations 74 through 104 may not have records associated with them. In this case, the pointer doesn't exist (i.e. the pointer is null), and the pointer location is empty. When the time comes for simulating this set of time slices, the system ignores the time slice group associated with the null pointer, and proceeds with simulating later time slice groups.

When a node is added into the system, the parent node pointer location 72 is caused to point to the parent node of the new node. Similarly, the pointer location 74, 76, 78, 80, 82, 84, 86, 88, 90, 92, 94, 96, 98, 100, 102, or 104, corresponding to the time slice of the new node being added, is updated to point to any relevant child nodes. Event records have no child nodes, and therefore have no pointer locations 74 through 104.

Inserting a new event location is as simple as traversing the tree. Referring again to FIG. 4, assume that the event 44 causes a new event to be inserted into the queue, perhaps due to an output of a component changing as a result of the simulation of the event at node 44, or due to any other reason that a simulation will create a new event to be simulated. Further, assume that the time slice the event to be inserted is 0x2200 time slices into the future.

Since it is known that event 44 is at time slice 0x0, and it is also known that the MSD (the leftmost nonzero digit within the hexadecimal representation of the time slice) of the current time slice is different than the MSD of the time slice of the event being inserted, the tree is traversed upward to the node representing the MSD of the time slice of the event being inserted. At that node, node 50 in this case, the tree is traversed downward according to each digit of the time slice being inserted.

Here, the tree is traversed from node 50 to the node representing a "2" from that node. There may or may not be a node at that location, depending on the specifications set forth by the system designers. For the purposes of this discussion, it is assumed that there is no node at that location, so it needs to be created. Thus, node 50 had no pointer in its child pointer location 78 (as previously seen in FIG. 5), and therefore node 54 is added by creating a new record and updating the child pointer location 78 in node 50 to point to the new record. The parent pointer 62 for the newly added node 54 must be updated to point to node 50.

Since a new node 54 had to be created, the system also knows that any child nodes of node 54 will also be new nodes. Therefore, the system now adds a new node representing the "2" in the third digit position in the hex representation of the time slice. The time slice representing the event being inserted is 0x2200, and the node representing the MSD has been created. Now, a second new node is created corresponding to the "2" (in the time slice, the third digit position from the left) off of node 54, and update the child pointer location 78 for node 54 to point to the newly created node. Now, the parent pointer 72 for the new node is updated to point to node 54.

Similarly, one additional node, representing the digit "0" in the second position of the four digit time slice (0x2200), is created, and the associated parent and child pointers are updated. Finally, the event itself is added as a child record in the "0" pointer 74 of the previously added new node.

Figure 6:
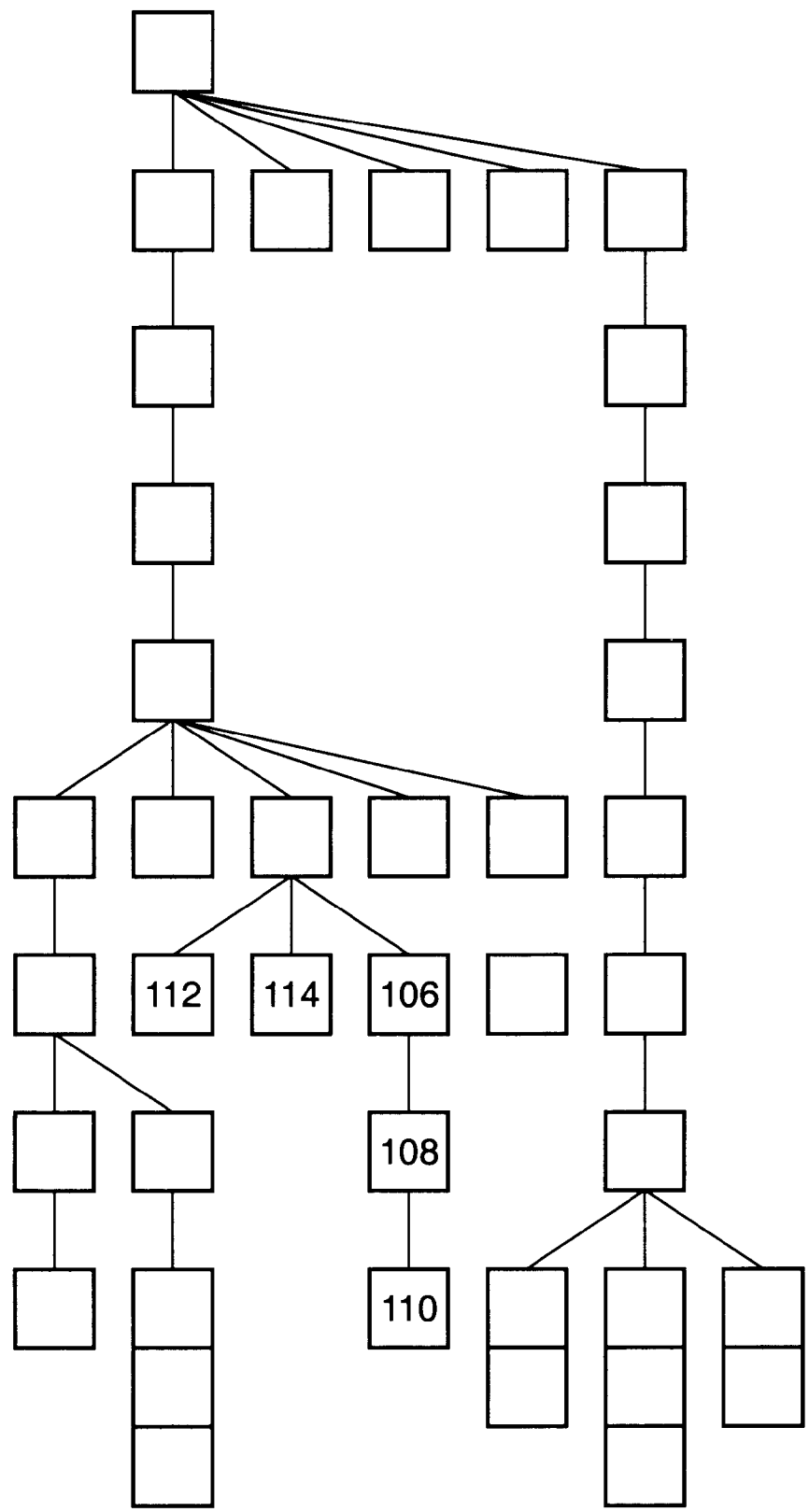
FIG. 6 is a hex tree diagram depicting the results of adding a new event to the tree of FIG. 4 in accordance with a presently preferred embodiment of the present invention.

FIG. 6 is a hex tree diagram depicting the results of adding a new event to the tree of FIG. 4 in accordance with a presently preferred embodiment of the present invention.

Referring to FIG. 6, new intermediate nodes 106 and 108 have been created, representing nodes leading to the new event 110. Nodes 112 and 114 are placed in the diagram for illustrative purposes only. They represent null nodes which have no underlying event nodes. Nodes 112 and 114 may or may not be present as nodes in the system, depending on the designer's choice.

It will be readily appreciated by those of ordinary skill in the art that the method of the present invention is much faster than utilizing the prior art linked list approach. The present invention required under ten steps to insert an event record into the tree even though the time slice for the inserted event was 32728 time slices away from the current period being simulated. This high insertion speed would result even from a tree which was fully populated, i.e. if all time slices between the current time and the time slice of the event to be inserted all had events associated with them. However, when using a doubly linked list, a fully populated time queue would have resulted in a search of 32738 records.

Figure 7:
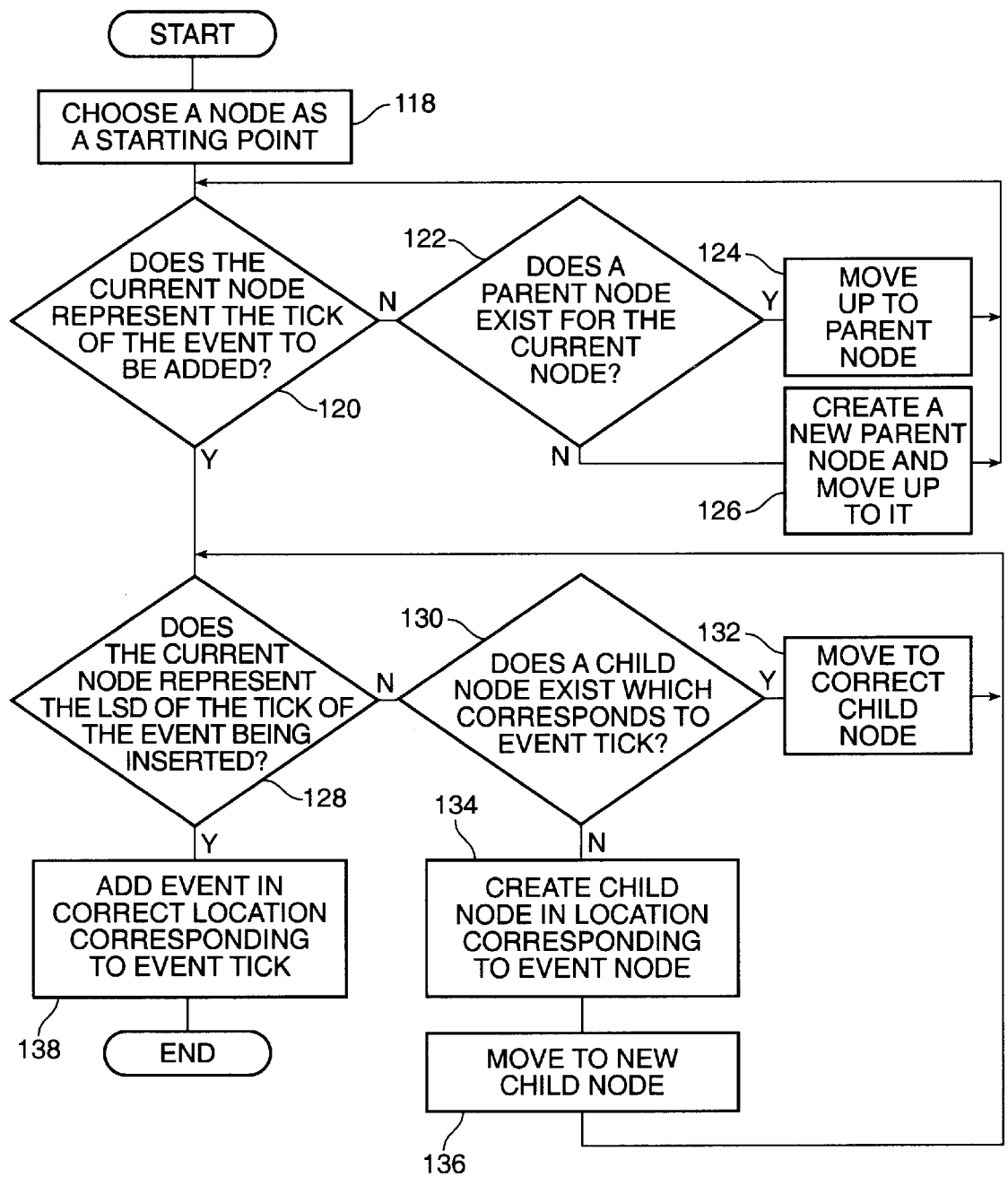
FIG. 7 is a flow chart depicting steps in a method carried out in accordance with a presently preferred embodiment of the present invention.

FIG. 7 is a flow chart depicting steps in a method carried out in accordance with a presently preferred embodiment of the present invention.

Referring to FIG. 7, a node within the tree structure is selected as a starting point at step 118. If the tree has just been newly created, the tree may comprise one record, and that record may represent an event location such as event location 44 as seen in FIG. 4. However, in an alternative embodiment, the total time to be simulated may be known, and as a result the tree structure defined as nodes 28, 34, 46, 48, 50, 116, and 60, may be created prior to adding any event locations.

At step 120, it is determined whether the node just chosen as a starting point (and now designated the "current node" for convenience) represents a range of time slices of which the time slice of the event node to be inserted is a subset. If not, at step 122 it is determined whether a parent node exists for the current node.

If, at step 122, a parent node exists for the current node, the parent node is selected as the new current node at step 124, and the method proceeds again with step 120.

If, however, at step 122, a parent node to the current node does not exist, a new parent node is created at step 126, and that new parent node is selected as the new current node. Here, the current node, prior to the new parent record being added, would be a null pointer because the current node would be the highest node in the tree. A new node record is created, such as that seen in FIG. 5, and a pointer to that record is added to the current node, at parent pointer location 72, as seen in FIG. 5. Also, the new parent node record must have a pointer to the current node added into its child pointer location 74, which corresponds to the location for time now. For the purposes of this discussion, the newly created parent node is now designated as the current node, and the method proceeds with step 120.

If, at step 120, it was determined that the current node does represent a range of time slices having the time slice of the event to be inserted as a subset, at step 128 it is determined whether the current node represents the least significant digit of the time slice. This is the same as asking whether the current node has, as its child "nodes", event locations, rather than other intermediate nodes which themselves have child nodes.

If, in step 128, it is determined that the current node is not directly above event locations, the method proceeds with step 130 wherein it is determined whether a child node of the current node exists which itself represents a set of time slices which includes the time slice of the event to be inserted. If so, in step 132 the proper child node is selected and designated as the current node. The method then proceeds with step 128.

In step 130, it may have been determined that the needed child node does not exist off of the current node. In this case, the desired child node is created in step 134, and the newly created node is selected as the new current node in step 136 and the method proceeds with step 128.

In step 128, it may have been determined that the current node is the node directly above event locations. If so, all that is left to do is to add the event, at step 138, into the proper location below the current node. In the presently preferred embodiment, a hex tree is used, making the current node represent sixteen individual time slices. To add the event, a pointer to the event record is added into the proper child pointer location 74 through 104 within the current location, and to add the corresponding parent node pointer for the current location into the event record. At this point the method terminates until a new event is required to be entered into the tree.

Those of ordinary skill in the art will readily recognize that the present invention may be easily adapted to a wide variety of systems, including electronic circuit simulators, aircraft simulators, automotive simulators, and systems which schedule large volume financial transactions, and any other system wherein future events are spawned from current events, and wherein a time queue must track those future events to ensure that they are executed at the proper times.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. In a simulation system, a method for inserting an event into a simulation time queue, the simulation time queue represented by a tree structure, the tree structure having a top node which represents the total number of time slices to be simulated, intermediate nodes representing subsets of time slices within the total number of time slices to be simulated, and event locations representing events to be simulated, wherein a time slice is defined to represent a minimum resolvable time period within the simulation, the method comprising the steps of:

choosing a starting node within the tree structure, and designating it as the current location;

determining whether said current location is an intermediate node representing a range of time slices of which the time slice of the event to be inserted is a subset;

determining, if said current location is an intermediate node representing a range of time slices of which the time slice of the event to be inserted is a subset, if any existing child nodes of said current location are event locations; and adding, if any existing child nodes of said current location are event locations, the event to the proper event location of said current location.

2. The method of claim 1 further comprising the step of:

determining, if said current location is not an intermediate node representing a range of time slices of which the time slice of the event to be inserted is a subset, whether a parent node of said current location exists; and designating, if said parent node exists, said parent node as the current location.

3. The method claim 2 further including the step of:

creating, if said parent node does not exist, said parent node.

4. The method of claim 1 further comprising the steps of:

determining, if no child nodes of said current location are event locations, if a child node of said current location exists which represents a superset of the time slice of the event to be inserted; and designating, if no child nodes of said current location are event locations, and if a child node of said current location exists which represents a superset of the time slice of the event to be inserted, the child node of said current location representing a superset of the time slice of the event to be inserted as the current location.

5. The method of claim 4 further comprising the step of:

adding, if a child node of said current location does not exist which represents a superset of the time slice of the event to be inserted, a new child node of said current location, said new child node being a node representing a superset of the time slice of the event to be inserted.

6. A computer system for simulating events, said computer system comprising:

processing means for processing instructions;

first memory for storing said instructions;

second memory for storing an event queue, said event queue in the form of a hex tree structure having a top node, at least one intermediate node, and at least one event location.

7. A method for simulating events, the events being arranged in a hex tree structure having a top node, at least one intermediate node, and at least one event location, the method comprising the steps of:

choosing a first event to be simulated;

determining whether the occurrence of said first event will cause at least one additional event to occur; and for each one of said at least one additional events:

determining a time slice at which said one of said at least one additional event will occur; and adding said one of said at least one additional event at a location representing said time slice using a hex tree.

\* \* \* \* \*